(12) United States Patent
Katsumata (10) Patent No.: US 7,141,846 B2
(45) Date of Patent: Nov. 28, 2006

(54) SEMICONDUCTOR STORAGE DEVICE AND METHOD FOR MANUFACTURING THE SAME

(75) Inventor: Ryota Katsumata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 11/076,882

(22) Filed: Mar. 11, 2005

(65) Prior Publication Data

US 2006/0094184 A1   May 4, 2006

(30) Foreign Application Priority Data

Nov. 1, 2004   (JP) ............................. 2004-318231

(51) Int. Cl.
*H01L 21/8242* (2006.01)
*H01L 27/108* (2006.01)

(52) U.S. Cl. .................. 257/301; 257/302; 257/E27.92

(58) Field of Classification Search ........ 257/301–302, 257/313
See application file for complete search history.

(56) References Cited

U.S. PATENT DOCUMENTS 5,225,698 A * 7/1993 Kim et al. .................. 257/303

6,355,519 B1   3/2002 Lee
6,664,583 B1  12/2003 Yang et al.
6,780,704 B1   8/2004 Raaijmakers et al.

FOREIGN PATENT DOCUMENTS

JP   2001-200363   7/2001

* cited by examiner

*Primary Examiner*—H. Jey Tsai
(74) *Attorney, Agent, or Firm*—Oblon, Spivak, McClelland, Maier & Neustadt, P.C.

(57) ABSTRACT

There is disclosed a semiconductor storage device comprising a trench capacitor wherein a high dielectric-constant insulator is used and formation of a depletion layer in a capacitor electrode is suppressed. The semiconductor storage device comprises a trench formed in a semiconductor substrate, a high dielectric-constant insulator formed on an inner wall of the trench, a first electrode formed in the semiconductor substrate contacting with the high dielectric-constant insulator and containing dopants to provide conductivity, a second electrode formed to fill the trench and containing the same dopants at least at the same concentration as in the first electrode, and a trench capacitor which includes the first electrode, the high dielectric-constant insulator and the second electrode and in which a depletion layer capacitance ratio (C/C0) is 0.9 or more during an operation.

13 Claims, 14 Drawing Sheets

SEMICONDUCTOR STORAGE DEVICE AND METHOD FOR MANUFACTURING THE SAME

CROSS-REFERENCE TO RELATED APPLICATIONS

This application is based upon and claims the benefit of priority from prior Japanese Patent Application No. 2004-318231, filed Nov. 1, 2004, the entire contents of which are incorporated herein by reference.

BACKGROUND OF THE INVENTION

1. Field of the Invention

The present invention relates to a semiconductor storage device and a method for manufacturing the same, and more particularly to a semiconductor storage device which has a trench structure and a method for manufacturing the same.

2. Description of the Related Art

Miniaturization of a semiconductor device has been accompanied by a reduction in an area of a capacitor which stores charges in a dynamic random access memory (DRAM), and it is now a significant task to secure a sufficient capacitance.

Thinning of a capacitor insulator film is effective for increasing capacitance of the capacitor with the same area. However, it poses a problem of an increase in leakage current. When a high dielectric-constant insulator is used as a capacitor insulator, the capacitor can be increased in capacitance without any increase in leakage current using an insulator with the same thickness. Thus, studies have been conducted to change the capacitor insulator from a silicon oxy-nitride (SiNO) film commonly used at present to a high dielectric-constant insulator, e.g., an aluminum oxide ($Al_2O_3$) film.

As another method for increasing the capacitance of the capacitor, increasing an effective surface area of a capacitor is disclosed in, for example, Jpn. Pat. Appln. KOKAI Publication No. 2001-200363. According to this method, a silicon film having a rugged surface, e.g., a hemi-spherical grain (HSG) surface, is used as a lower electrode of a stack or trench capacitor. Generally, formation of a high-quality insulator on such a rugged surface in a sufficient coverage is not easy. A method in that patent overcomes the problem to increase the coverage better. However, a process thereof is complex, and more improvements need to use it practically. Additionally, the trench capacitor uses a trench inner wall as a capacitor. Thus, a trench diameter must be increased to use the HSG silicon film, which is not beneficial for promoting miniaturization.

As another problem, it has been discovered that, for example, when polysilicon is used as a capacitor electrode, a depletion layer formed in the electrode substantially lowers the capacitance of the capacitor to reduce effects of the thinning of the capacitor insulator. The formation of the depletion layer in the electrode can be suppressed by setting a high dopant concentration in polysilicon or silicon used for the electrode.

In a present trench DRAM capacitor, doping to one of electrode (plate electrode) formed in a silicon substrate is carried out by, e.g., solid-phase diffusion from arseno-silicate glass (AsSG) or gas phase diffusion using phosphine ($PH_3$). For example, when a doping amount of arsenic (As) in the plate electrode is set high, As is also doped into silicon substrate in an upper part of the trench by auto-doping, where the doping of As is undesired. Consequently, even a channel region of a metal oxide semiconductor (MOS) transistor is doped with As, causing a problem of deterioration of subthreshold characteristics.

Therefore, there is a need for a semiconductor storage device comprising a trench capacitor in which a high dielectric-constant insulator is used and formation of a depletion layer in a capacitor electrode is suppressed, and a method for manufacturing the same.

BRIEF SUMMARY OF THE INVENTION

According to one aspect of the present invention, a semiconductor storage device comprises a trench formed in a semiconductor substrate, a high dielectric-constant insulator formed on an inner wall of the trench, a first electrode formed in the semiconductor substrate contacting with the high dielectric-constant insulator and containing dopants to provide conductivity, a second electrode formed to fill the trench and containing the same dopants at least at the same concentration as in the first electrode, and a trench capacitor which includes the first electrode, the high dielectric-constant insulator and the second electrode and in which a depletion layer capacitance ratio (C/C0) is 0.9 or more during an operation.

According to another aspect of the present invention, a method for manufacturing a semiconductor storage device comprises forming a trench in a semiconductor substrate, forming a high dielectric-constant insulator on an inner wall of the trench, depositing a silicon film doped with dopants at a high concentration in the trench, and introducing the dopants from the silicon film to the semiconductor substrate through the high dielectric-constant insulator.

According to still another aspect of the present invention, a method for manufacturing a semiconductor storage device comprises forming a trench in a semiconductor substrate, forming a high dielectric-constant insulator on an inner wall of the trench, depositing a silicon film on the high dielectric-constant insulator, and simultaneously introducing dopants into the silicon film and the dopants into the semiconductor substrate through the high dielectric-constant insulator.

DETAILED DESCRIPTION OF THE INVENTION

The accompanying drawings, which are incorporated in and constitute a part of the specification, illustrate embodiments of the invention, and together with the general description given above and the detailed description of the embodiments given below, serve to explain the principles of the invention.

The embodiments of the present invention will be described in detail with reference to the accompanying drawings. Throughout the drawings, corresponding portions are denoted by corresponding reference numerals.

(First Embodiment)

According to a first embodiment, there is provided a semiconductor storage device comprising a trench DRAM capacitor. In the trench DRAM capacitor, a high dielectric-constant insulator is used for a capacitor capacitive insulator, and a plate electrode formed in a substrate of a trench surface is doped through the high dielectric-constant insulator with dopants at a high concentration which is originally doped in a node electrode formed in a trench, and a method for manufacturing the same. The embodiment will be described by taking an example of an n channel trench DRAM cell. However, the embodiment is in no way limited to this example.

Figure 1:
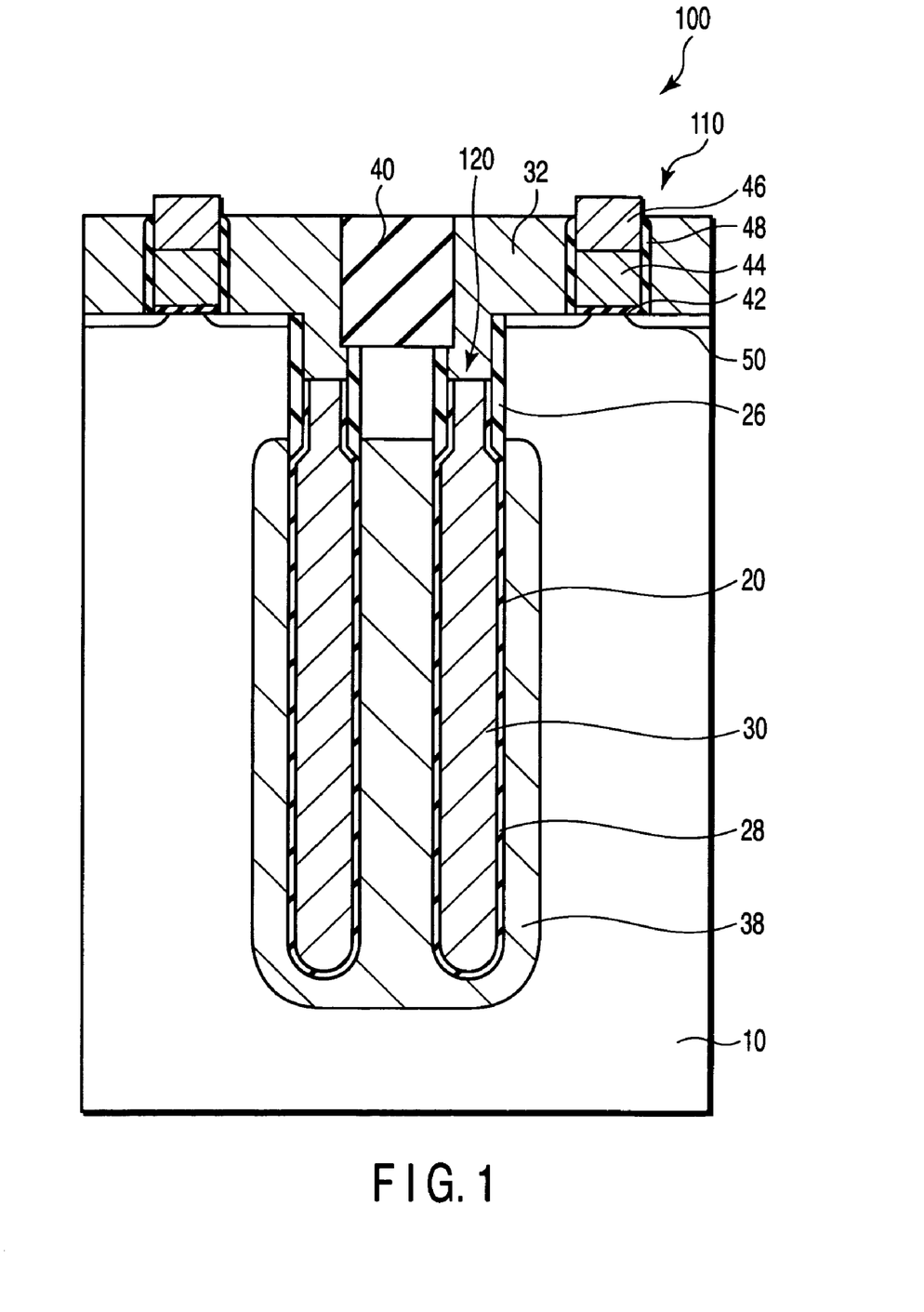
FIG. 1 is a sectional view showing an example of a trench DRAM cell which includes a trench capacitor according to a first embodiment of the present invention.

FIG. 1 is a sectional view showing an example of a trench DRAM cell 100 according to the embodiment. FIG. 1 shows two adjacent memory cells. The DRAM cell 100 comprises a MOS transistor 110 and a trench capacitor 120. The trench capacitor 120 includes a plate electrode 38, a capacitive insulator 28, and a node electrode 30. The plate electrode 38 is formed in an inner wall of a trench disposed in a substrate, excluding an upper part portion thereof. The capacitive insulator 28 is formed on the plate electrode 38, and comprises a high dielectric-constant insulator. The node electrode 30 is formed to fill the trench surrounded by the capacitive insulator 28, and contains an n type dopant, e.g., phosphorus (P) at a high concentration. By diffusing the n type dopant from the node electrode 30 to the silicon substrate 10 through the capacitive insulator 28, the silicon substrate 10 is doped with the dopant to form the plate electrode 38. Additionally, a collar oxide film 26 is formed to prevent diffusion of the dopant from the plate electrode 30 to a channel region of the MOS transistor 110.

Referring to FIGS. 2 to 8, description will be given to an example of a manufacturing process of the semiconductor storage device which comprises the trench capacitor 120 according to the embodiment.

Figure 2:
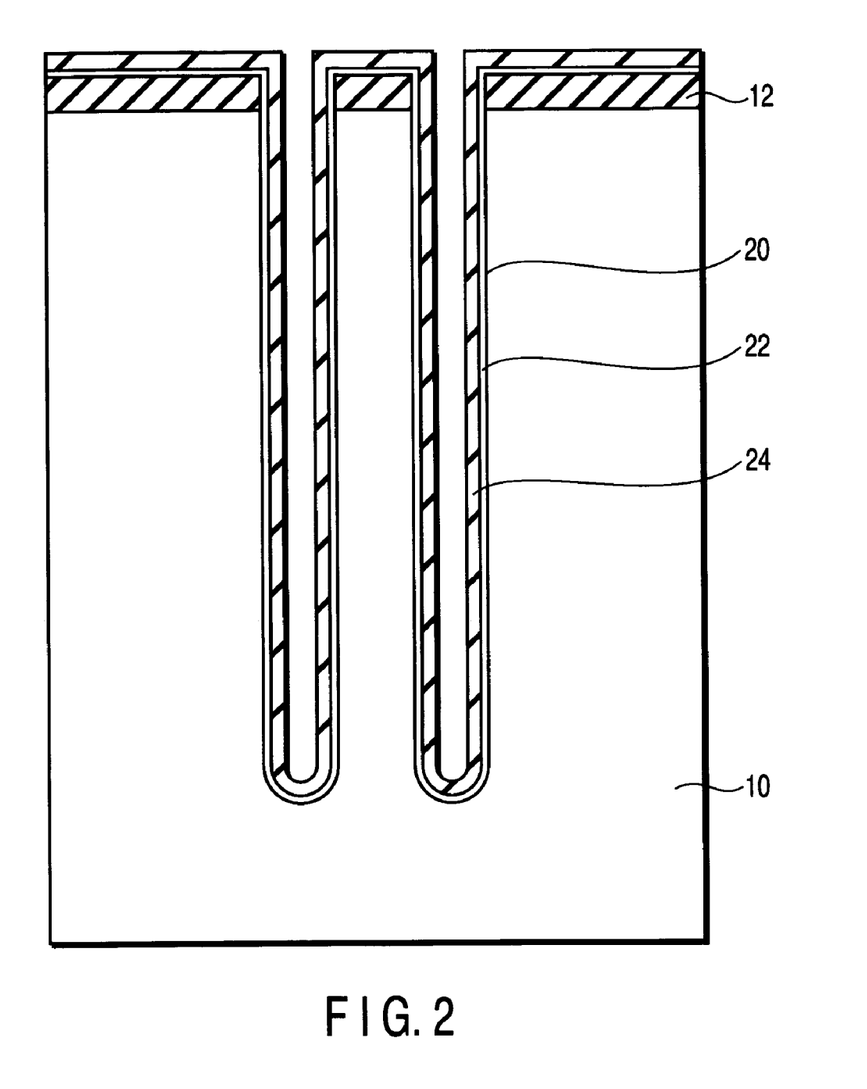
FIG. 2 is a sectional view showing an example of a manufacturing process according to the first embodiment of the invention.
Figure 3:
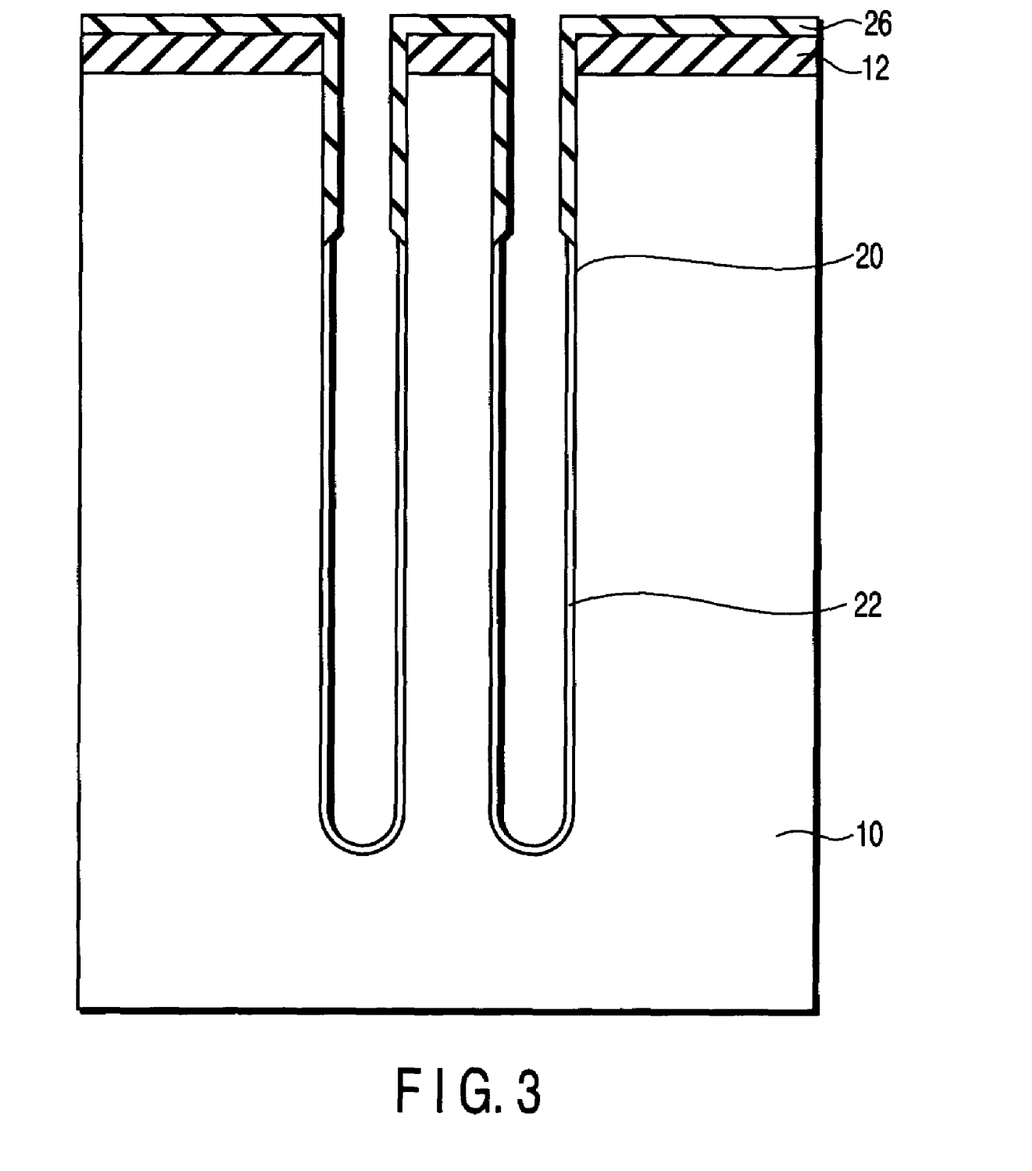
FIG. 3 is a sectional view showing the example of the manufacturing process of the first embodiment subsequent to FIG. 2.

(1) First, a trench 20 is being formed in the silicon substrate 10 to dispose the capacitor 120 as shown in FIG. 2, and the collar oxide film 26 shown in FIG. 3 is being formed on an upper part of the trench 20.

Specifically, a first silicon nitride film (SiN film) 12 is deposited on an entire surface of the silicon substrate 10, and a trench pattern for a capacitor is formed in the first SiN film 12 by lithography and etching. By using the first SiN film 12 as a mask, a trench 20 with a desired depth is formed in the silicon substrate 10 by an anisotropic dry etching (reactive ion etching: RIE).

Further, as shown in FIG. 2, a first thin silicon film (Si film) 22 is deposited on an entire surface including inside of the trench 20, then a second SiN film 24 is deposited. A resist (not shown) is formed only in a lower part of the trench 20. The second SiN film 24, exposed upper part of the trench 20 and deposited on the surface of the substrate 10, is selectively removed by etching, e.g., wet etching or isotropic dry etching. Then, the resist is removed from the inside of the trench 20. Local oxidation of silicon (LOCOS) is executed by using the second SiN film 24 as a mask to oxidize the first Si film 22 and the silicon substrate 10 so as to form a LOCOS oxide film (collar oxide film) 26 on the upper part of the trench 20 and on the first SiN film 12. Subsequently, the second SiN film 24 used as the mask in the LOCOS oxidation is removed. Accordingly, the collar oxide film 26 is formed on the upper part of the trench 20, and a structure shown in FIG. 3 is obtained.

Figure 4:
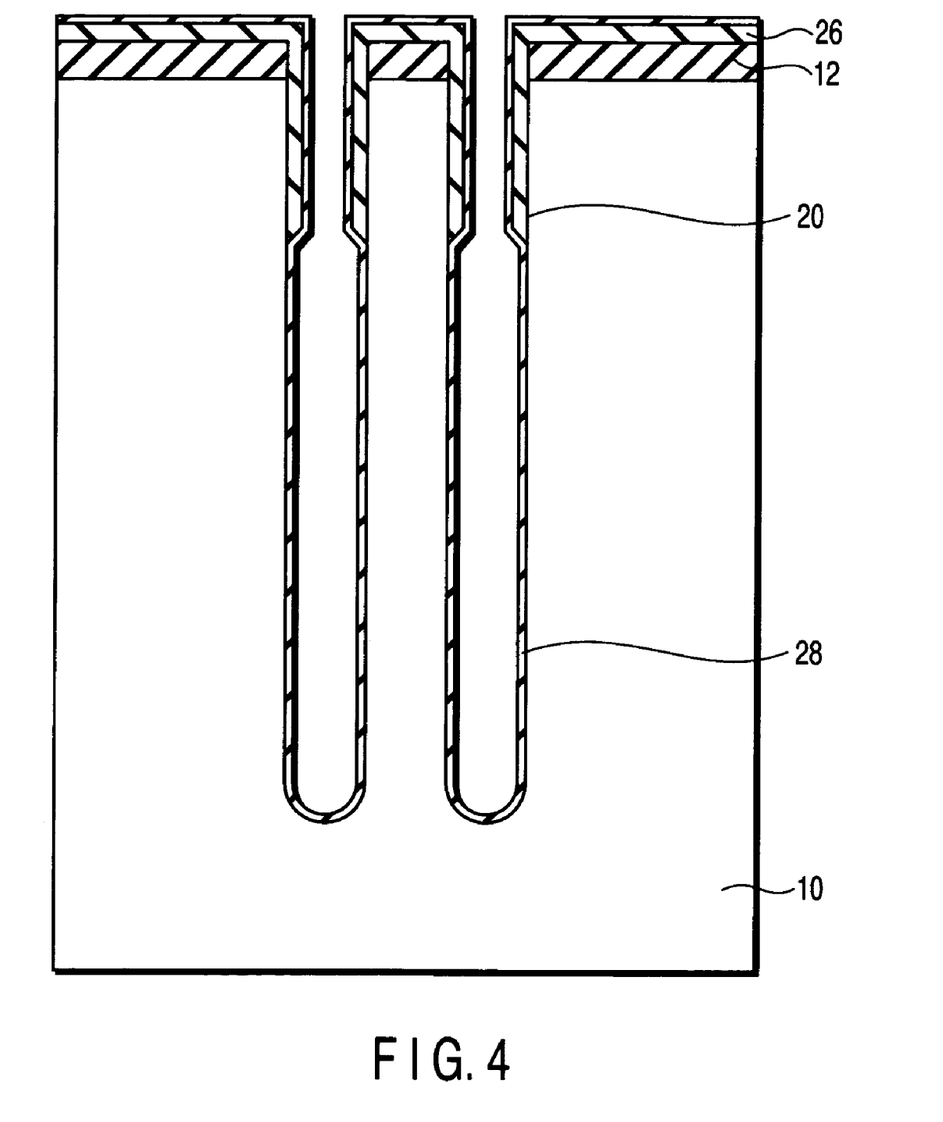
FIG. 4 is a sectional view showing the example of the manufacturing process of the first embodiment subsequent to FIG. 3.

(2) Next, as shown in FIG. 4, a high dielectric-constant insulator 28, e.g., an aluminum oxide film ($Al_2O_3$ film), is being formed as a capacitive insulator.

Before forming the $Al_2O_3$ film 28, the first Si film 22 is removed to expose the silicon substrate 10 of the lower part of the trench 20. Then, the inside of the trench 20 is cleaned, and simultaneously a very thin silicon oxide film ($SiO_2$ film) (not shown) is formed. Further, the very thin $SiO_2$ film is nitrided by treating in an atmosphere containing ammonium ($NH_3$). Subsequently, an $Al_2O_3$ film 28 is deposited with a thickness of 5 nanometers (nm) on an entire surface including the inside of the trench 20 by, e.g., atomic layer deposition (ALD). Then, the $Al_2O_3$ film 28 is densified by annealing.

As for the capacitive insulator 28 of the capacitor, in addition to the $Al_2O_3$ film, for example, an $Al_2O_3$ film added with nitrogen or carbon, or a combination of an $Al_2O_3$ film and a hafnium oxide film ($Hf_2O_3$ film) having a higher dielectric constant than that of the $Al_2O_3$ film can be used.

Figure 5:
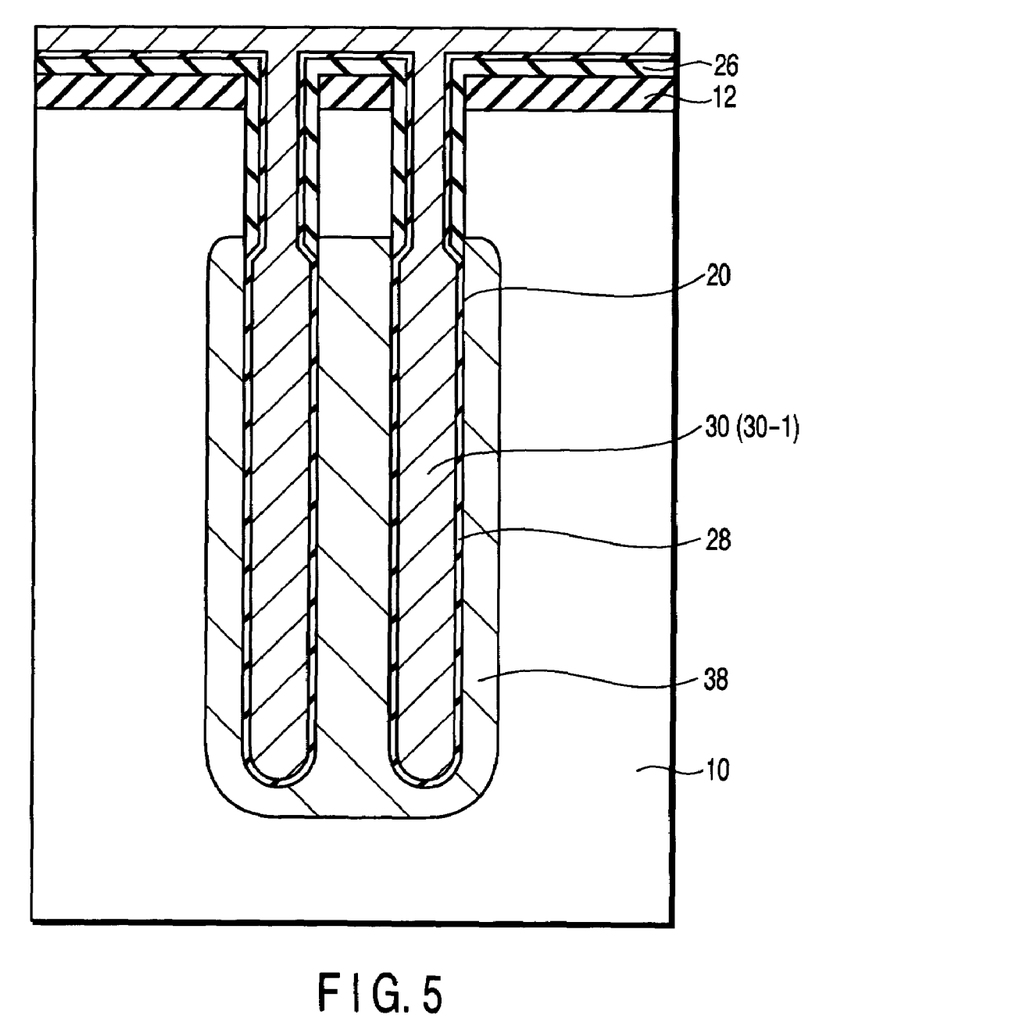
FIG. 5 is a sectional view showing the example of the manufacturing process of the first embodiment subsequent to FIG. 4.

(3) Next, as shown in FIG. 5, a node electrode 30 is being formed in the trench 20, and dopants are being diffused from the node electrode 30 to the silicon substrate 10 through the capacitive insulator 28 to form a plate electrode 38.

Specifically, a second amorphous silicon film (a-Si film) 30-1 doped with an n type dopant, e.g., phosphorus (P), at a high concentration is deposited to fill the trench 20 by, e.g., LPCVD, to form the node electrode 30. As detailed later, a phosphorus concentration in the second a-Si film is preferably $5\times10^{19}$ atoms/cm$^3$ or more, and more preferably $1\times10^{20}$ atoms/cm$^3$ or more.

Subsequently, for example, annealing is executed at 1000° C. or higher to diffuse phosphorus from the node electrode 30 to the silicon substrate 10 through the $Al_2O_3$ film 28, thereby forming a plate electrode 38 in the inner wall of the trench 20. Since phosphorus has a small atomic radius, it passes through inter-lattice of the $Al_2O_3$ film. During the annealing, the second a-Si film of the node electrode 30 crystallizes to a polysilicon film. The annealing for phosphorus diffusion can be carried out not just after the deposition of the second a-Si film 30 but in annealing being executed after a MOS transistor is formed.

Figure 6:
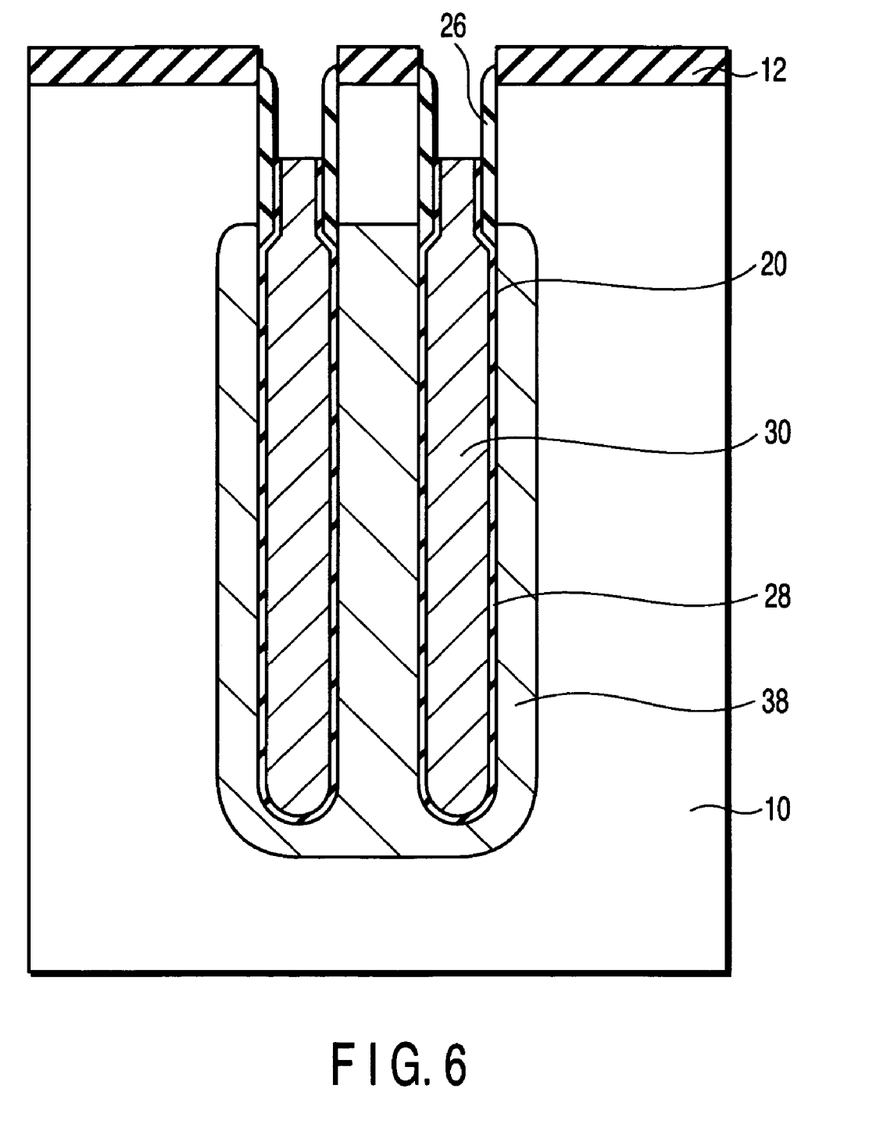
FIG. 6 is a sectional view showing the example of the manufacturing process of the first embodiment subsequent to FIG. 5.
Figure 7:
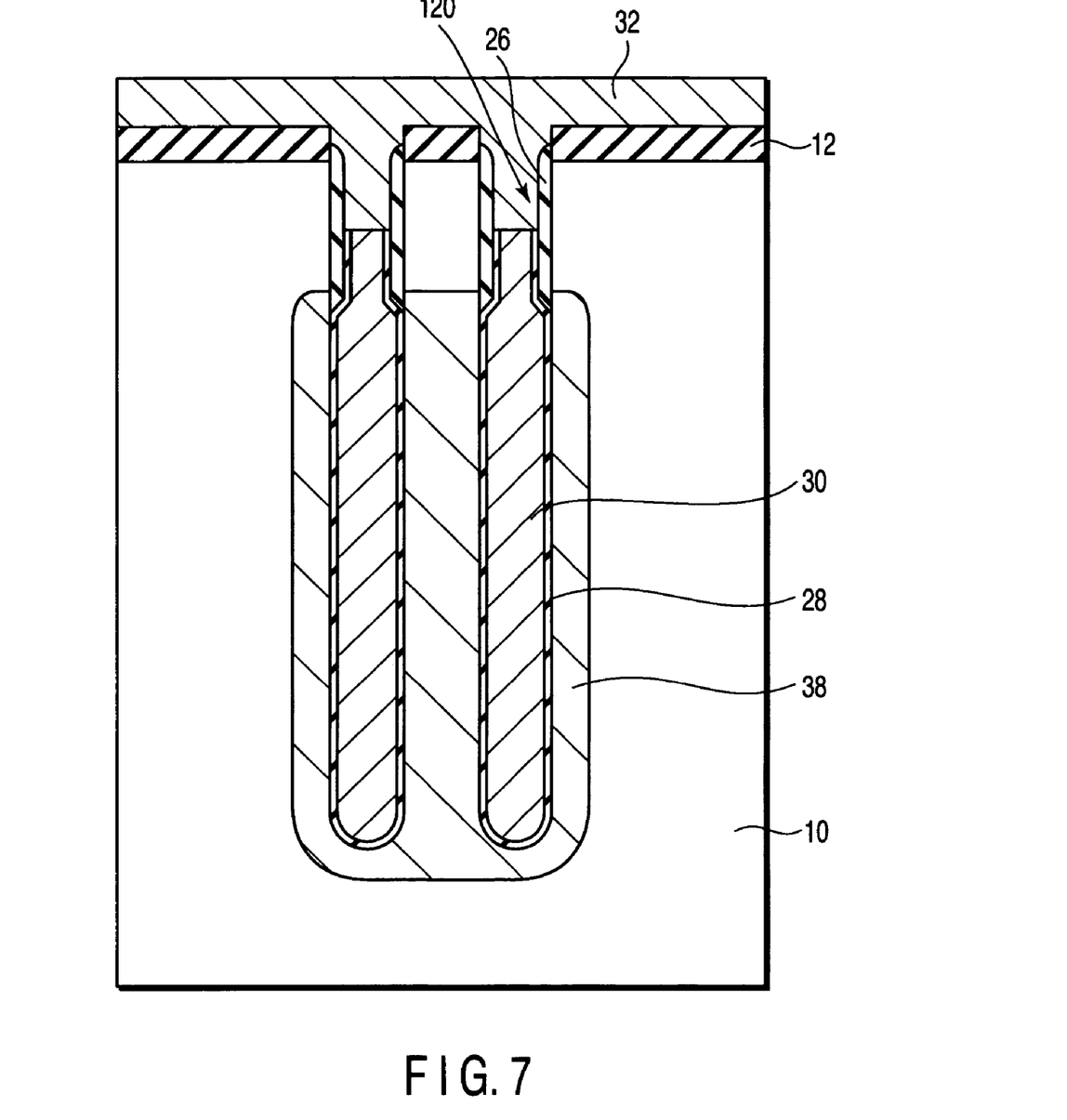
FIG. 7 is a sectional view showing the example of the manufacturing process of the first embodiment subsequent to FIG. 6.

(4) Next, as shown in FIG. 6, the second Si film 30 above the vicinity of an opening of the trench 20 is removed by, e.g., isotropic dry etching. Then, the $Al_2O_3$ film 28 exposed on the upper part of the trench 20 is removed by, e.g., hot phosphoric acid. Subsequently, the collar oxide film 26 near the opening of the trench 20 is removed by, e.g., anisotropic dry etching, thereby a structure shown in FIG. 6 is obtained. Further, a third silicon film 32 doped with phosphorus at a high concentration is deposited on an entire surface, thereby a trench capacitor 120 shown in FIG. 7 can be formed.

Figure 8:
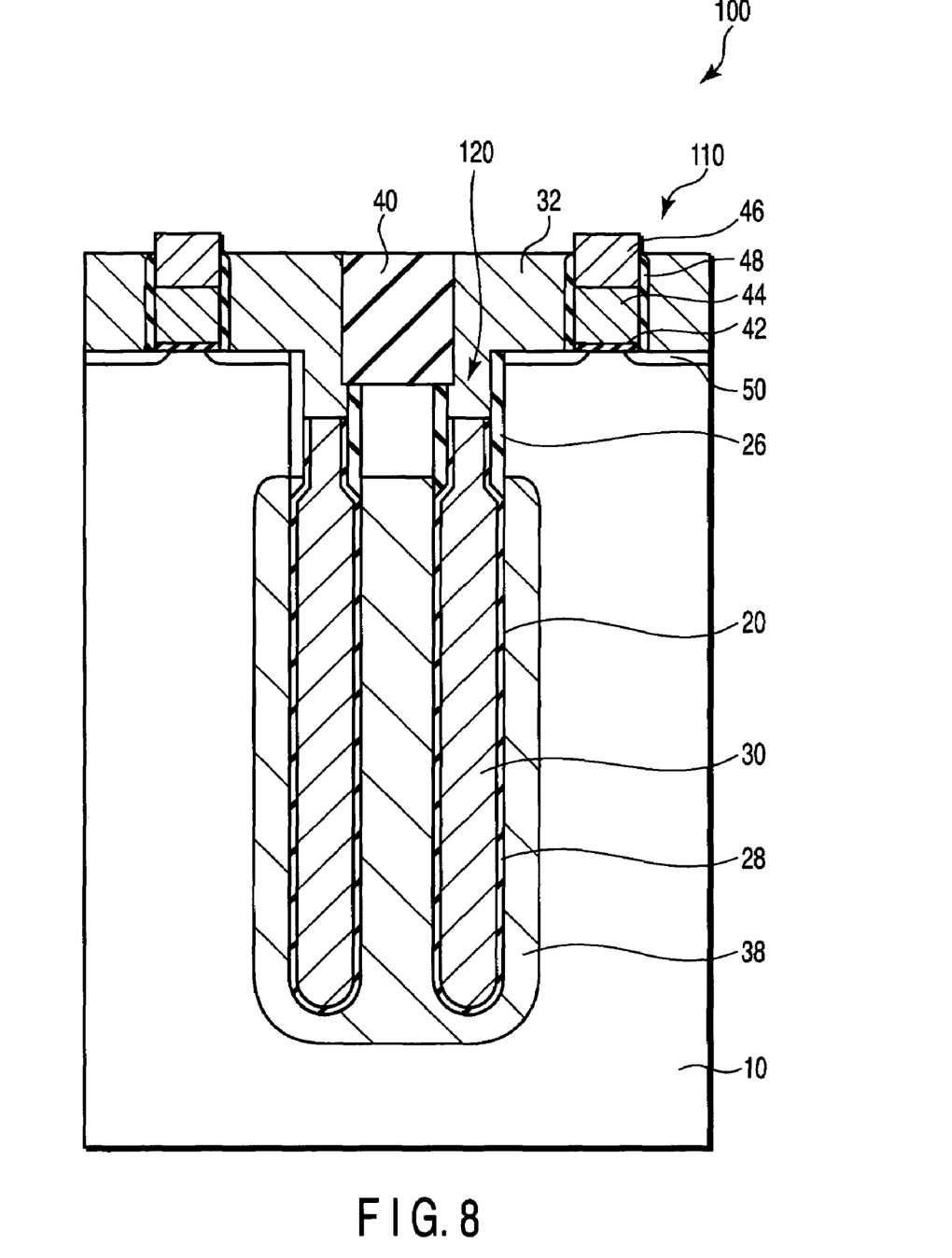
FIG. 8 is a sectional view showing the example of the manufacturing process of the first embodiment subsequent to FIG. 7.

Subsequently, a MOS transistor 110 that includes a isolation 40, a gate insulator 42, gate electrodes 44, 46, a side wall insulator 48, and a source/drain 50 is formed, whereby a trench DRAM cell 100 shown in FIG. 8 can be formed.

Further, through steps such as multilayer wiring necessary for the semiconductor device, the semiconductor storage device that includes the trench capacitor 120 is completed.

Description will be given to a necessary dopant concentration to be doped in the node electrode 30 and the plate electrode 38. If dopant concentrations in the capacitor electrodes 30, 38 are low, a depletion layer is formed in either one of the capacitor electrodes in the device operation. The depletion layer is equivalent to an increased thickness of the capacitor insulator, causing a substantial reduction in the capacitance of the capacitor. A depletion layer capacitance ratio of the capacitor electrode depends not only on the thickness of the depletion layer simply but also on a thickness of the gate insulator. Here, the depletion layer capacitance ratio is a ratio (C/C0) between a combined capacitance (C) including the depletion layer in the gate electrode and the gate insulator and a capacitance (C0) of the insulator only.

Figure 9:
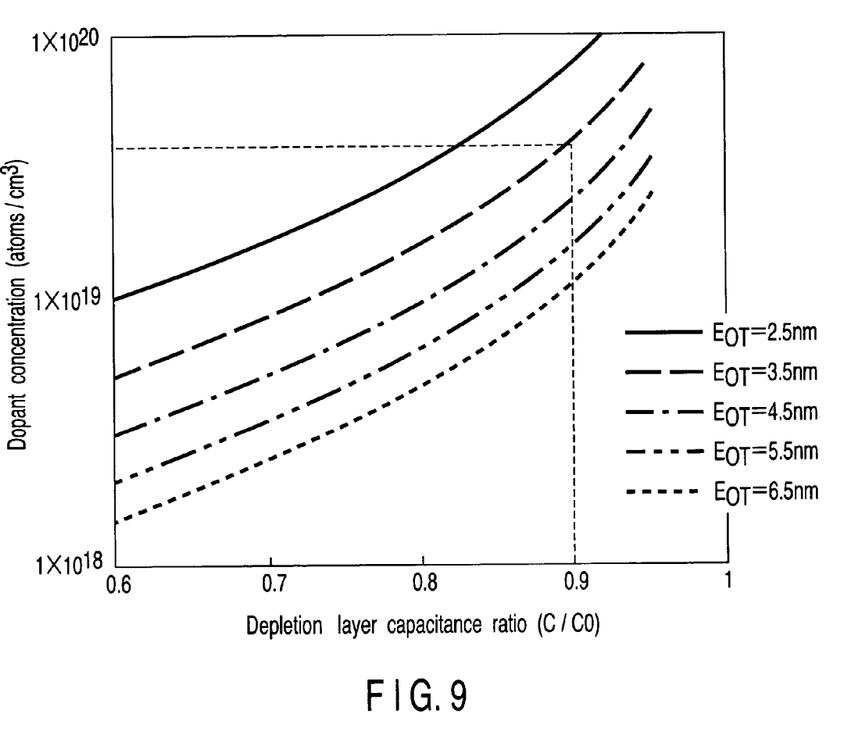
FIG. 9 is a view showing a relation between an dopant concentration and a depletion layer capacitance ratio in a gate electrode.

FIG. 9 is a view showing a relation between a dopant concentration in the capacitor electrode (vertical axis) and a depletion layer capacitance ratio of the capacitor (C/C0) (horizontal axis). A capacitance of the capacitor is preferably large, but it is not uniquely decided because of a close relation to other designing factors of the DRAM device. The depletion layer capacitance ratio closer to 1 is more preferable. A smaller depletion layer capacitance ratio reduces thinning effects of the capacitive insulator. Accordingly, since a limit of a reduction in the capacitance of the capacitor is about 10%, the depletion layer capacitance ratio is preferably 0.9 or more. The depletion layer capacitance ratio is more preferably 0.95 or more. FIG. 9 shows a depletion layer capacitance ratio as a function of a dopant concentration in the electrode with an equivalent oxide thickness $E_{OT}$ of the capacitor insulator as a parameter. Each upward-rising curve indicates that a thickness of a depletion layer is smaller as the dopant concentration in the electrode is higher. As the equivalent oxide thickness $E_{OT}$ of the semiconductor storage device in focus is 3.5 nm, attention will be paid to a second broken line from above. It can be understood from FIG. 9 that a dopant concentration in the electrode must be $5 \times 10^{19}$ atoms/cm$^3$ or more to achieve a depletion layer capacitance ratio of 0.9 or more. Further, to achieve a depletion layer capacitance ratio of 0.95 or more, a dopant concentration in the electrode must be $1 \times 10^{20}$ atoms/cm$^3$ or more.

Regarding the operation of the capacitor, when the plate electrode is fixed at ½·Vcc, Vcc is applied to the node electrode while data is "1", and 0V is applied to the node electrode while data is "0", an electric field applied on the capacitor is reversed depending on the data value. As a result, there is a possibility that a depletion layer can be formed in the node electrode while the data is "1" and in the plate electrode while the data is "0". In other words, depending on the operation state of the semiconductor storage device, there is a possibility that a depletion layer can be formed in either of the plate electrode or the node electrode. Thus, in both of the plate electrode and the node electrode, dopant concentrations are set $5 \times 10^{19}$ atoms/cm$^3$ or more, and preferably close each other.

Therefore, it can be provided the semiconductor storage device comprising the trench capacitor wherein the high dielectric-constant insulator is used and the formation of a depletion layer in the capacitor electrode is suppressed, and the method for manufacturing the same.

(Second Embodiment)

Figure 10:
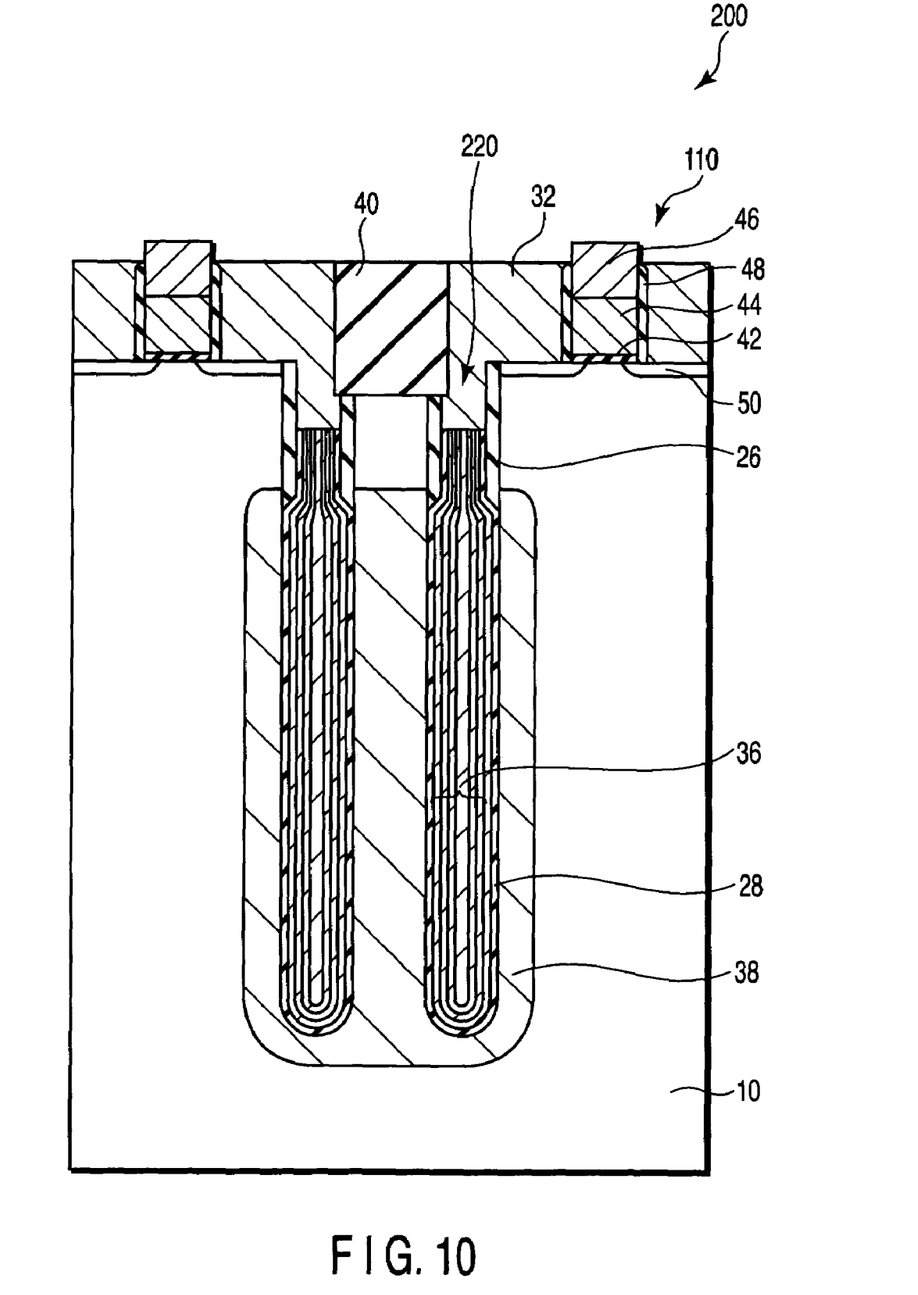
FIG. 10 is a sectional view showing an example of a trench DRAM cell which includes a trench capacitor according to a second embodiment of the present invention.

According to a second embodiment, there is provided a semiconductor storage device comprising a trench capacitor 220. In the trench capacitor 220, a doping to a node electrode 36 formed in a trench is carried out via gas phase diffusion. FIG. 10 shows an example of a trench DRAM cell 200 of the embodiment. According to the embodiment, the node electrode 36 has a laminated structure as shown in FIG. 10, since the node electrode 36 is formed in the trench by repeating formation of a thin silicon film and doping the silicon film with dopants via the gas phase diffusion. A plate electrode 38 is also doped with dopants simultaneously during the doping of the node electrode 36.

Referring to FIGS. 11 to 14, an example of a manufacturing method of the semiconductor storage device 200 of the embodiment will be described. The manufacturing method is different from that of the first embodiment only in the method for forming the node electrode 36 as described above. Steps before the formation of the node electrode 36 are similar to the steps (1), (2) in the first embodiment, steps after the formation of the node electrode 36 are also similar to those after the step (4) in the first embodiment, and thus description thereof will be omitted.

Figure 11:
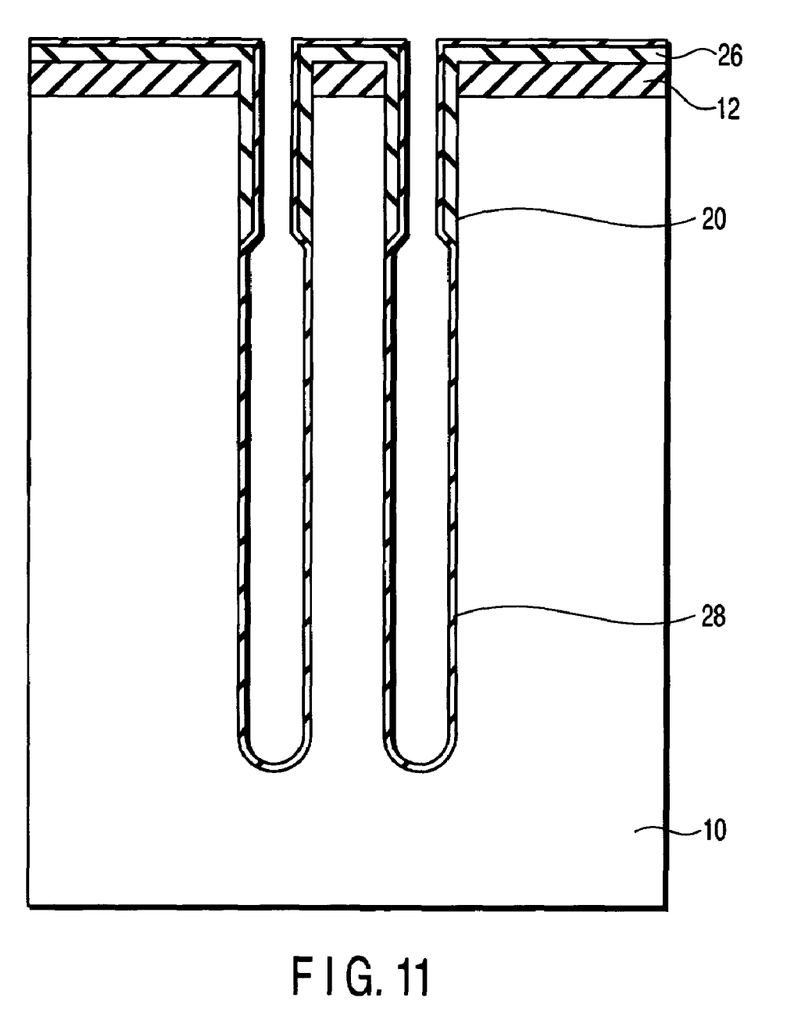
FIG. 11 is a sectional view showing an example of a manufacturing process according to the second embodiment of the invention.

FIG. 11 is a view in which a collar oxide film 26 is formed on an upper part of a trench 20 and a capacitive insulator 28, such as an $Al_2O_3$ film 28, is formed on an inner wall of the trench 20.

Figure 12:
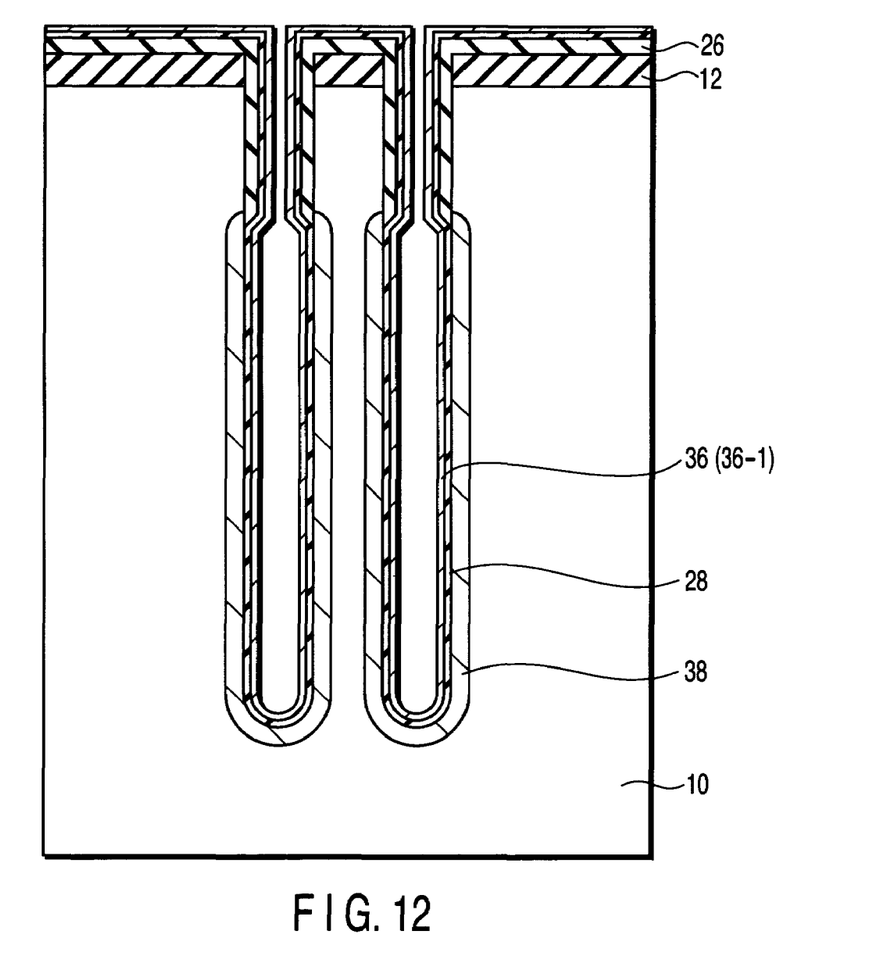
FIG. 12 is a sectional view showing the example of the manufacturing process of the second embodiment subsequent to FIG. 11.

As shown in FIG. 12, a node electrode 36 is being formed in the trench 20, and simultaneously a plate electrode 38 is being formed in a silicon substrate 10 around the trench 20.

Specifically, a fourth silicon film (a-Si film) 36-1 undoped with dopants is deposited with a thickness of, e.g., 10 to 20 nm, on an $Al_2O_3$ film 28 in the trench 20. Next, a heat treatment is carried out in an atmosphere containing phosphorus, e.g., phosphine (PH$_3$), at a high temperature, e.g., 850° C. to 1000° C., diffusing phosphorus into the a-Si film 36-1. Thus a polysilicon film (node electrode) 36 doped with phosphorus at a high concentration is formed. During the diffusion, the phosphorus diffuses into the silicon substrate 10 around the trench 20 through the thin $Al_2O_3$ film 28, thereby forming a plate electrode 38. In the phosphorus diffusion, the phosphorus is continuously supplied. Thus, a phosphorus concentration in the node electrode 36 and a surface phosphorus concentration of the plate electrode 38 contacting with the $Al_2O_3$ film 28 are defined by solid solubility of the phosphorus at the treatment temperature, and become substantially equal to each other. Additionally, the phosphorus concentration can be controlled by changing the treatment temperature. In other words, for a treatment at a higher temperature, doping with phosphorus at a higher concentration is possible.

The deposition and the phosphorus doping of the a-Si film 36-1 can be executed in the same equipment, or in separate equipments.

Figure 13:
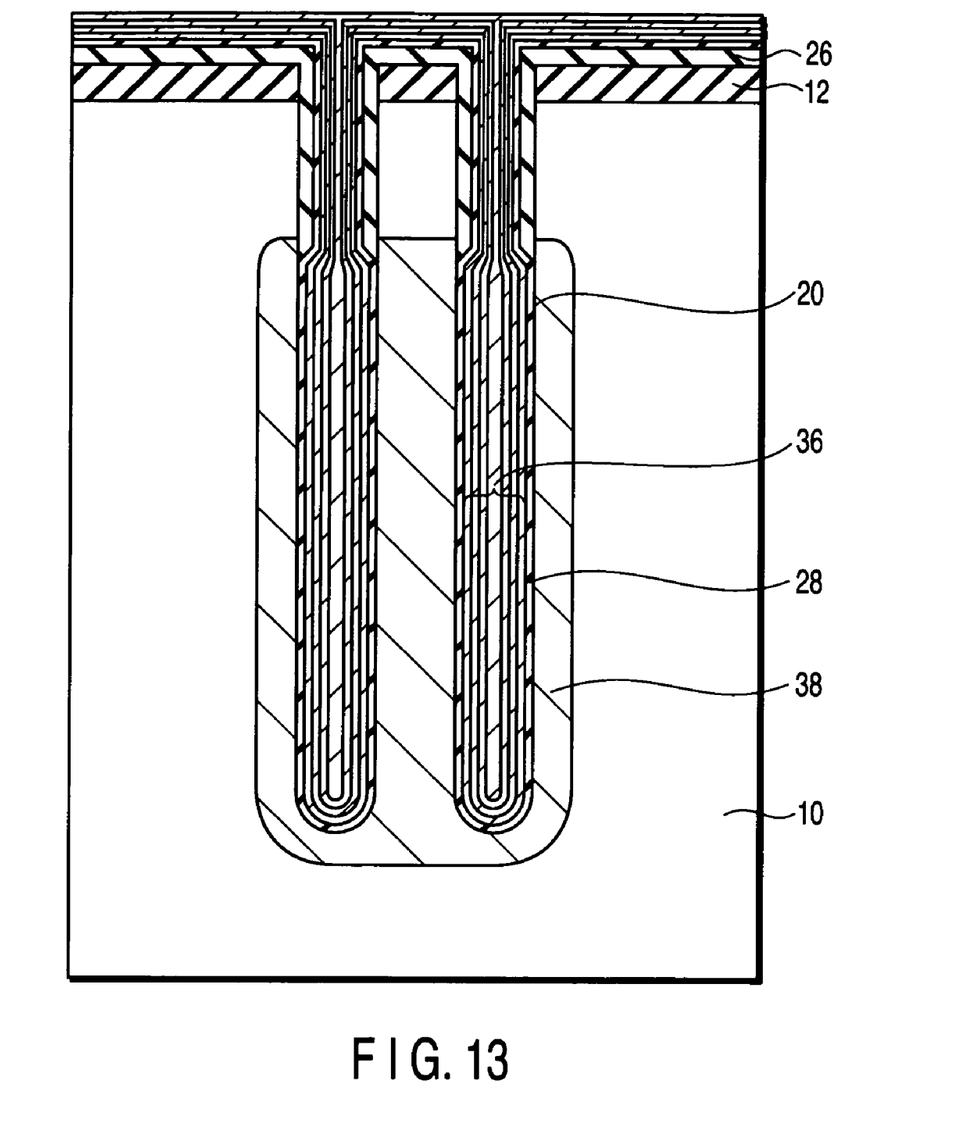
FIG. 13 is a sectional view showing the example of the manufacturing process of the second embodiment subsequent to FIG. 12.

Moreover, the deposition and the phosphorus doping of the a-Si film 36-1 can be repeated by a plurality of times. Thus, as shown in FIG. 13, the node electrode 36 with layered polysilicon can be formed.

Figure 14:
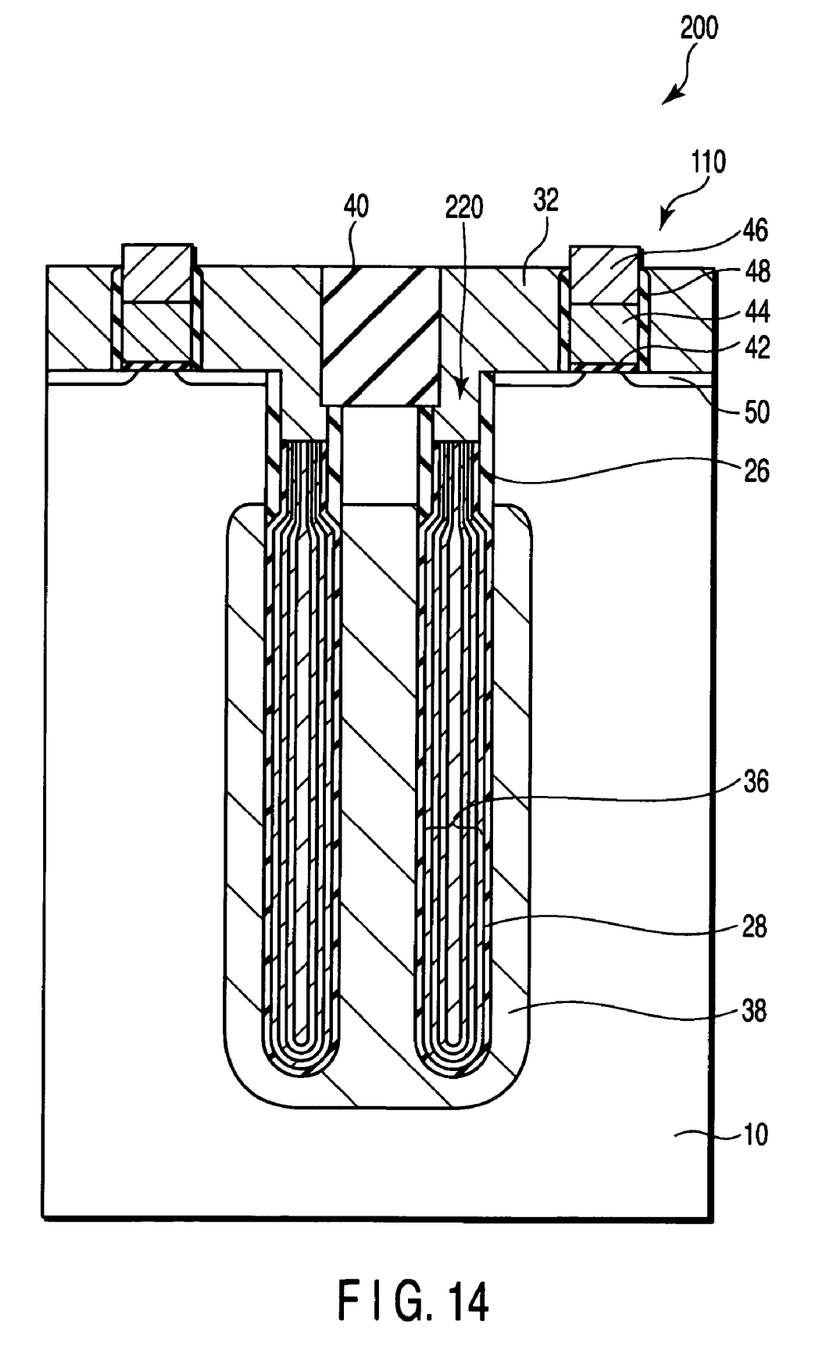
FIG. 14 is a sectional view showing the example of the manufacturing process of the second embodiment subsequent to FIG. 13.

Subsequently, steps after the step (4) in the first embodiment are executed to complete the trench capacitor 220, then an isolation 40 and a MOS transistor 110 are formed. Thus, the trench DRAM cell 200 comprising the trench capacitor 220 is completed as shown in FIG. 14.

The second embodiment has advantages that an amount of dopants can be easily controlled, for example, the dopant concentrations of the node electrode 36 and the plate electrode 38 can be set high and substantially equal to each other, and the like.

Thus, it can be manufactured the semiconductor storage device according to the second embodiment comprising the trench capacitor wherein the high dielectric-constant insulator is used and the depletion layer in the capacitor electrode is suppressed.

The embodiments have been described by way of case in which the dopant doping of the plate electrode 38 is diffused from the node electrodes 30 or 36 through the $Al_2O_3$ film 28. However, other methods, e.g., a method for doping from gas phase into the silicon substrate 10 after the formation of the collar oxide film 26, can be used together.

As described above, according to the present invention, it can be provided the semiconductor storage device comprising the trench capacitor wherein the high dielectric-constant insulator is used and the formation of the depletion layer in the capacitor electrode is suppressed, and the method for manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor storage device comprising:
   a trench formed in a semiconductor substrate;
   a high dielectric-constant insulator formed on an inner wall of the trench;
   a first electrode formed in the semiconductor substrate contacting with the high dielectric-constant insulator and containing dopants to provide conductivity;
   a second electrode formed to fill the trench and containing the same dopants at least at the same concentration as in the first electrode; and
   a trench capacitor which includes the first electrode, the high dielectric-constant insulator and the second electrode and in which a depletion layer capacitance ratio (C/C0) is 0.9 or more during an operation.

2. The semiconductor storage device according to claim 1, wherein the dopants in the first electrode are introduced from the second electrode through the high dielectric-constant insulator.

3. The semiconductor storage device according to claim 1, wherein a concentration of the dopants in the electrode on an interface between the first or second electrode and the high dielectric-constant insulator is equal to/more than $5\times10^{19}$ atoms/cm$^3$.

4. The semiconductor storage device according to claim 1, wherein the high dielectric-constant insulator contains aluminum and oxygen.

5. The semiconductor storage device according to claim 4, wherein the high dielectric-constant insulator further contains at least one of nitrogen and carbon.

6. The semiconductor storage device according to claim 5, wherein the high dielectric-constant insulator further contains hafnium.

7. The semiconductor storage device according to claim 1, wherein the dopants are phosphorus.

8. The semiconductor storage device according to claim 7, wherein the dopants in the first electrode are introduced from the second electrode through the high dielectric-constant insulator.

9. The semiconductor storage device according to claim 8, wherein a concentration of the dopants in the electrode on an interface between the first or second electrode and the high dielectric-constant insulator is equal to/more than $5\times10^{19}$ atoms/cm$^3$.

10. The semiconductor storage device according to claim 8, wherein the high dielectric-constant insulator contains aluminum and oxygen.

11. The semiconductor storage device according to claim 10, wherein the high dielectric-constant insulator further contains at least one of nitrogen and carbon.

12. The semiconductor storage device according to claim 11, wherein the high dielectric-constant insulator further contains hafnium.

13. The semiconductor storage device according to claim 7, wherein the high dielectric-constant insulator contains aluminum and oxygen.

* * * * *